United States Patent
Oh et al.

(10) Patent No.: US 8,969,713 B2
(45) Date of Patent: Mar. 3, 2015

(54) METHOD OF MANUFACTURING PHOTOELECTRIC CONVERSION DEVICE

(75) Inventors: Min-Seok Oh, Yongin-si (KR);
Jung-Tae Kim, Seoul (KR); Nam-Kyu Song, Hwaseong-si (KR); Min Park, Seoul (KR); Yun-Seok Lee, Yongin-si (KR); Czang-Ho Lee, Hwaseong-si (KR); Myung-Hun Shin, Suwon-si (KR); Byoung-Kyu Lee, Suwon-si (KR); Yuk-Hyun Nam, Goyang-si (KR); Seung-Jae Jung, Seoul (KR); Mi-Hwa Lim, Chungcheongnam-do (KR); Joon-Young Seo, Seoul (KR); Dong-Uk Choi, Seoul (KR); Dong-Seop Kim, Seoul (KR); Byoung-June Kim, Seoul (KR)

(73) Assignee: Samsung SDI Co., Ltd., Yongin-Si, Gyeonggi-Do (KR)

( * ) Notice: Subject to any disclaimer, the term of this patent is extended or adjusted under 35 U.S.C. 154(b) by 0 days.

(21) Appl. No.: 13/359,606

(22) Filed: Jan. 27, 2012

(65) Prior Publication Data

US 2012/0129295 A1    May 24, 2012

Related U.S. Application Data

(62) Division of application No. 12/476,645, filed on Jun. 2, 2009, now Pat. No. 8,802,972.

(30) Foreign Application Priority Data

Dec. 24, 2008   (KR) .......................... 10-2008-0133646

(51) Int. Cl.
*H01L 31/0224* (2006.01)
*H01L 31/0376* (2006.01)
(Continued)

(52) U.S. Cl.
CPC ...... *H01L 31/022441* (2013.01); *H01L 31/182* (2013.01); *H01L 31/022425* (2013.01);
(Continued)

(58) Field of Classification Search
CPC .............. H01L 31/182; H01L 31/1824; H01L 31/022441
See application file for complete search history.

(56) References Cited

U.S. PATENT DOCUMENTS

| 4,169,740 A | 10/1979 | Kalbitzer et al. |
| 5,053,083 A | 10/1991 | Sinton |

(Continued)

FOREIGN PATENT DOCUMENTS

| DE | 27 56 861 A1 | 6/1979 |
| EP | 1 113 505 A2 | 7/2001 |

(Continued)

OTHER PUBLICATIONS

USPTO Non-Final Rejection, dated Jan. 13, 2013, from U.S. Appl. No. 12/476,645, Min-Seok Oh, et al.

(Continued)

*Primary Examiner* — Matthew Martin
*Assistant Examiner* — Christopher Danicic
(74) *Attorney, Agent, or Firm* — Lee & Morse, P.C.

(57) ABSTRACT

Disclosed herein is a photoelectric conversion device having a semiconductor substrate including a front side and back side, a protective layer formed on the front side of the semiconductor substrate, a first non-single crystalline semiconductor layer formed on the back side of the semiconductor substrate, a first conductive layer including a first impurity formed on a first portion of a back side of the first non-single crystalline semiconductor layer, and a second conductive layer including the first impurity and a second impurity formed on a second portion of the back side of the first non-single crystalline semiconductor layer.

7 Claims, 9 Drawing Sheets

(51) Int. Cl.
*H01L 31/068* (2012.01)
*H01L 31/078* (2012.01)
*H01L 31/0236* (2006.01)
*H01L 31/18* (2006.01)
*H01L 31/072* (2012.01)
*H01L 31/0368* (2006.01)

(52) U.S. Cl.
CPC .. *H01L31/022466* (2013.01); *H01L 31/03762* (2013.01); *H01L 31/068* (2013.01); *H01L 31/072* (2013.01); *H01L 31/03682* (2013.01); *H01L 31/0682* (2013.01); *H01L 31/078* (2013.01); *Y02E 10/52* (2013.01); *Y02E 10/548* (2013.01); *H01L 31/02363* (2013.01); *Y02E 10/547* (2013.01)
USPC .......................................... 136/256; 136/261

(56) References Cited

U.S. PATENT DOCUMENTS

| | | | | |
|---|---|---|---|---|
| 5,641,362 | A * | 6/1997 | Meier ........................ | 136/256 |
| 5,759,292 | A | 6/1998 | Arimoto et al. | |
| 6,180,869 | B1 * | 1/2001 | Meier et al. ................ | 136/256 |
| 2001/0008295 | A1 | 7/2001 | Sakata et al. | |
| 2005/0062041 | A1 | 3/2005 | Terakawa et al. | |
| 2007/0169808 | A1 | 7/2007 | Kherani et al. | |
| 2008/0000522 | A1 | 1/2008 | Johnson et al. | |
| 2008/0173347 | A1 | 7/2008 | Korevaar et al. | |
| 2009/0223562 | A1 * | 9/2009 | Niira et al. .................... | 136/256 |
| 2009/0308457 | A1 * | 12/2009 | Smith ........................... | 136/261 |
| 2010/0087031 | A1 | 4/2010 | Veschetti et al. | |

FOREIGN PATENT DOCUMENTS

| | | | |
|---|---|---|---|
| EP | 1 873 840 A1 | 1/2008 | |
| KR | 10-2007-0092953 A | 9/2007 | |
| WO | WO 2008/037658 A2 | 4/2008 | |
| WO | WO2008/050889 * | 5/2008 | ............. H01L 31/04 |
| WO | WO 2008/050889 A1 | 5/2008 | |

OTHER PUBLICATIONS

European Office Action dated Apr. 26, 2013.
Tucci, M., et al., "Innovative design of amorphous/crystalline silicon heterojunction solar cell", Thin Solid Films, vol. 516, No. 20, pp. 6771-6774 (Aug. 30, 2008).
EP Search Report dated Mar. 2, 2011 from EP Application 09013446.1.
USPTO Final Rejection, dated Jun. 7, 2012, from U.S. Appl. No. 12/476,645, Min-Seok Oh, et al.
USPTO Office Action dated Aug. 30, 2013 from U.S. Appl. No. 12/476,645.
Advisory Action in copending U.S. Appl. No. 12/476,645, dated Jan. 24, 2014 (Oh, et al.).
European Office Action date Nov. 12, 2014.

* cited by examiner

METHOD OF MANUFACTURING PHOTOELECTRIC CONVERSION DEVICE

CROSS REFERENCE TO RELATED APPLICATION

This is a divisional application based on application Ser. No. 12/476,645, filed Jun. 2, 2009, now U.S. Pat. No. 8,802,972 the entire contents of which is hereby incorporated by reference.

This application claims priority to Korean Patent Application No. 10-2008-0133646, filed Dec. 24, 2008, the entire disclosure of which is hereby incorporated by reference herein in it's entirety.

BACKGROUND

1. Technical Field

The present disclosure relates to a photoelectric conversion device and a manufacturing method thereof. The present disclosure more particularly relates to a photoelectric conversion device, wherein the photoelectric conversion device having a semiconductor layer of which crystallinity is different from that of a semiconductor substrate thereon and the semiconductor layer includes impurity, thereby having high light conversion efficiency and a simple manufacturing process.

2. Description of Related Art

Solar cells, which include photoelectric conversion elements that convert solar light (visible electromagnetic radiation) into electricity, are sustainable and eco-friendly, and are therefore being utilized with increasing frequency.

A basic structure of the solar cell is a diode consisting of a PN junction, and the solar cell is divided into several kinds according to a material of a light adsorption layer.

A solar cell using silicon as a light adsorption layer is largely divided into two kinds, for example, crystalline (single crystalline and polycrystalline) wafer type solar cell and thin film type (amorphous and polycrystalline) solar cell. Furthermore, there are chemical compound solar cells using CIGS(CuInGaSe2) or CdTe as a light adsorption layer, 3-5 group solar cell, organic solar cell and dye-sensitized solar cell, etc.

Hetero junction solar cells use a crystalline semiconductor substrate as a light adsorption layer, and a non-single crystalline semiconductor layer on the substrate, which has a different crystallinity contrary to the semiconductor substrate.

Conventional hetero junction solar cells have an anode and a cathode collector electrode on both front and back sides of the semiconductor substrate. In this structure, the collector electrode (cathode or anode) blocks solar light with an electrode on the incident side of the solar cell.

A conventional hetero junction solar cell has a transparent electrode on both a front and back side of the semiconductor substrate. Because of this, there may be a loss of transmittance due to the transparent electrode, and this may decrease incident light efficiency. In addition, the resistance of the transparent electrode is greater than that of a collector electrode increasing the total resistance of the solar cell.

SUMMARY

In accordance with an exemplary embodiment of the present invention, a photoelectric conversion device is provided. The photoelectric conversion device includes: a semiconductor substrate having a front side and back side, a protective layer formed on the front side of the semiconductor substrate, a first non-single crystalline semiconductor layer formed on the back side of the semiconductor substrate, a first conductive layer including a first impurity formed on a first portion of a back side of the first non-single crystalline semiconductor layer and a second conductive layer including the first impurity and a second impurity formed on a second portion of the back side of the first non-single crystalline semiconductor layer.

A concentration of the first impurity is less than that of the second impurity and the concentration of the second impurity is about 2 to about 10 times of the concentration of the first impurity.

The photoelectric conversion device further includes a transparent conductive layer formed on the back side of the first conductive layer and second conductive layer, and a collective electrode formed on the back side of the transparent conductive layer corresponding to the first portion and the second portion.

At least one of the semiconductor substrate, the first non-single crystalline semiconductor layer, the first conductive layer, the second conductive layer, and the transparent conductive layer includes an embossing. The first impurity includes a 3 or 5 group element, the second impurity includes a 3 or 5 group element and the first and second impurities include different group elements from each other.

In accordance with an exemplary embodiment of the present invention, a photoelectric conversion device is provided. The photoelectric conversion device includes: a semiconductor substrate having a front side and back side, a protective layer formed on the front side of the semiconductor substrate, a first non-single crystalline semiconductor layer formed on a first portion of the back side of the semiconductor substrate, a first conductive layer including a first impurity formed on a back side of the first non-single crystalline semiconductor layer, a second non-single crystalline semiconductor layer formed on a second portion of the back side of the semiconductor substrate, and a second conductive layer including the first impurity and a second impurity formed on the back side of the second non-single crystalline semiconductor layer.

A concentration of the first impurity is greater than or equal to that of the second impurity in the second conductive layer. The concentration of the second impurity in the second non-single crystalline semiconductor layer is substantially the same as the concentration of the first impurity in the first conductive layer.

The photoelectric conversion device in another embodiment of the present invention further includes: a transparent conductive layer formed on the back side of the first conductive layer and second conductive layer, a collective electrode formed on the back side of the transparent conductive layer corresponding to the first portion and the second portion.

At least one of the semiconductor substrate, the first non-single crystalline semiconductor layer, the first conductive layer, the second conductive layer, and the transparent conductive layer includes an embossing. The first impurity includes a 3 or 5 group element, the second impurity includes a 3 or 5 group element and the first and second impurities include different group elements from each other.

In accordance with an exemplary embodiment of the present invention, a manufacturing method of a photoelectric conversion device is provided. The method includes: forming a protective layer on a front side of a semiconductor substrate, forming a first non-single crystalline semiconductor layer, a first conductive layer including a first impurity and a transparent conductive layer on a back side of the semiconductor substrate, forming a first collective electrode on a first portion of a back side of the transparent conductive layer, and forming a second conductive layer including the first impurity and a second impurity by inputting a second impurity in a second portion of the first conductive layer, wherein the second portion of the first conductive layer has no first collective electrode on the back side of the first conductive layer.

The second impurity is inputted in the second portion using the first collective electrode as a mask. The concentration of the second impurity is greater than that of the first impurity in the second conductive layer.

The manufacturing method of a photoelectric conversion device further includes forming a second collective electrode on a back side of the second portion of the transparent conductive layer.

The concentration of the second impurity is less than or equal to that of the first impurity in the second conductive layer.

The manufacturing method of a photoelectric conversion device further includes forming a second non-single crystalline semiconductor layer by inputting a second impurity in the second portion of the first non-single crystalline semiconductor layer.

The manufacturing method of a photoelectric conversion device further includes forming a second collective electrode on a second portion of the back side of the transparent conductive layer.

In accordance with another exemplary embodiment of the present invention, a manufacturing method of a photoelectric conversion device is provided. The method includes forming a protective layer on a front side of a semiconductor substrate, forming a first non-single crystalline semiconductor layer, a first conductive layer comprising a first impurity and a first transparent conductive layer on a back side of the semiconductor substrate and forming a first collective electrode on the first transparent conductive layer in a first region of the back side of the semiconductor substrate. The method further includes removing the first transparent conductive layer, the first conductive layer, and the first non-single crystalline semiconductor layer, which are formed at the second region, forming a second non-single crystalline semiconductor layer, a second conductive layer that contains a second impurity, and a second transparent conductive layer at the whole back side of the semiconductor substrate, forming a second collective electrode on the second transparent conductive layer in a second region of the back side of the semiconductor substrate and removing the second non-single crystalline semiconductor layer, the second conductive layer, and the second transparent conductive layer, which are formed at the first region of the back side of the semiconductor substrate.

BRIEF DESCRIPTION OF THE DRAWINGS

Exemplary embodiments of the present invention can be understood in more detail from the following description taken in conjunction with the accompanying drawings, in which.

DETAILED DESCRIPTION OF THE EXEMPLARY EMBODIMENTS OF THE INVENTION

The present invention now will be described more fully hereinafter with reference to the accompanying drawings, in which some exemplary embodiments of the invention are shown. This invention may, however, be embodied in many different forms and should not be construed as limited to the exemplary embodiments set forth herein.

In the drawings, the thickness of layers and regions are exaggerated for clarity. Like numerals refer to like elements throughout. It will be understood that when an element such as a layer, region or substrate is referred to as being "on" another element, the element can be directly on the other element or intervening elements may also be present. In contrast, when an element is referred to as being "directly on" another element, there are no intervening elements present.

<Exemplary Embodiment 1>

Figure 1:
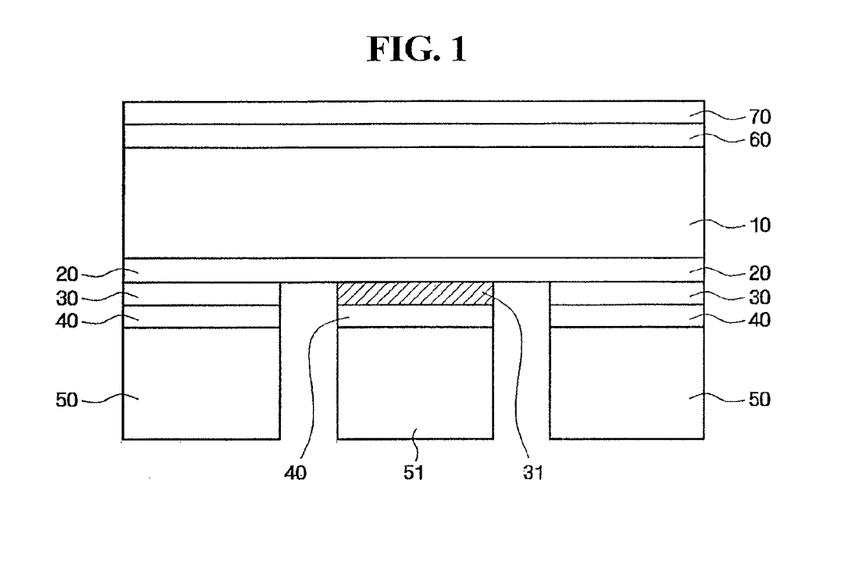
FIG. 1 is a cross-sectional view of a photoelectric conversion device according to an exemplary embodiment of the present invention.

Referring to the FIG. 1, a photoelectric conversion device according to the first exemplary embodiment of the present invention is explained.

FIG. 1 is a cross-sectional view of a photoelectric conversion device according to the first exemplary embodiment of the present invention.

The photoelectric conversion device includes a semiconductor substrate 10, having a front side and a back side, a protective layer 60 formed on the front side of the semiconductor substrate, an anti-reflection layer 70 formed on the front side of the protective layer, a first non-single crystalline semiconductor layer 20 formed on a back side of the semiconductor substrate 10, a first conductive layer 30 having a first impurity formed on a first portion of the back side of the first non-single crystalline semiconductor layer and a second conductive layer 31 having the first impurity and a second impurity formed on a second portion of the back side of the first non-single crystalline semiconductor layer.

A solar light is incident to the front side of the semiconductor substrate in this exemplary embodiment of the present invention.

For example, a single crystalline silicon wafer, polycrystalline silicon wafer or semiconductor wafer other than silicon is used to the semiconductor substrate 10, as a light adsorption layer. The semiconductor substrate may include, for example, a P type or N type impurity. Commonly, a single crystalline or polycrystalline semiconductor substrate having an N type impurity is used and a semiconductor wafer other than silicon having an N type impurity is used. A P type impurity may include group 3 chemical elements of the periodic table, for example, boron (B), aluminum (Al), gallium (Ga), etc. and the N type impurity may include group 5 chemical elements of the periodic table, for example, phosphorus (P), arsenic (As), etc. An electron and a hole are formed in the semiconductor substrate by energy from light introduced into the semiconductor substrate and the electron and hole move through the first non-single crystalline semiconductor layer 20 which is in contact with the semiconductor substrate 10.

A protective layer 60 which is formed on the front side of the semiconductor substrate 10 may protect the semiconductor substrate 10. For example, the protective layer may be an intrinsic amorphous silicon (a-Si) layer having no impurity, a doped a-Si layer having an impurity, or a compound layer of silicon nitride (SiNx)), silicon oxide (SiOx), titanium oxide (TiOx), zinc oxide (ZnO), zinc sulfide (ZnS), or etc.

An anti-reflection layer 70 may be added on the protective layer 60. The anti-reflection layer 70 may be formed of, for example, SiNx, etc. and may prevent a loss of light when light is introduced to the device. The protective layer 60 and the anti-reflection layer 70 can be, for example, a single layer and the single layer may play the role of a protective layer and an anti-reflection layer. The protective layer 60 and the anti-reflection layer 70 can be formed as explained above.

A first non-single crystalline semiconductor layer 20 is formed on a back side of the semiconductor substrate 10. The first non-single semiconductor layer 20 has a different crystallinity to the semiconductor substrate 10. For example, a single crystalline or polycrystalline silicon wafer having an impurity may be used as the semiconductor substrate 10, and an a-Si layer or microcrystalline silicon layer may be used as the first non-single crystalline semiconductor layer 20 on the back side of the substrate.

Conductive layers 30, 31 are formed on a first portion and a second portion of the back side of the first non-single crystalline semiconductor layer 20. The conductive layers 30, 31 form a P-N junction with the semiconductor substrate 10. The conductive layers 30, 31 may include, for example, an a-Si layer or microcrystalline silicon layer having an impurity. On the first portion, a first conductive layer 30 having a first impurity is formed and a second conductive layer 31 having the first impurity and a second impurity which is different from the first impurity is formed on the second portion. That is, the second conductive layer may include the first impurity and the second impurity. Here, the concentration of the second impurity is greater than that of the first impurity in the second conductive layer 31. However, the second conductive layer includes the first impurity and the second impurity, and the second conductive layer 31 has electrical polar opposite characteristic compared to the first conductive layer 30, because the concentration of the second impurity is greater than the first impurity. The first impurity may be, for example, a P type impurity and the second impurity may be, for example, an N type impurity. The first impurity may be, for example, an N type impurity and the second impurity may be, for example, a P type impurity. The concentration of the second impurity may be, for example, about 2 to about 10 times than that of the first impurity in the second conductive layer 31.

As illustrated in FIG. 1, a transparent conductive layer 40 is formed on the back side of the first conductive layer 30 and the second conductive layer 31. The transparent conductive layer 40 may include transparent and conductive material, such as, for example, indium tin oxide (ITO), indium zinc oxide (IZO), zinc oxide (ZnO), tin oxide (SnOx), or etc. The transparent conductive layer 40 may decrease contact resistance between a collector electrode 50(or 51) and the conductive layer 30(or 31). Collector electrodes 50, 51 are formed on the transparent conductive layer 40. The collector electrode may gather electricity made through the semiconductor substrate 10 and the conductive layers 30, 31 and may connect with an external device. The collector electrode may include, for example, a low resistance metal or its alloy such as silver (Ag), gold (Au), copper (Cu), aluminum (Al) etc.

A trench is formed between the first portion and the second portion and the trench divides the first portion and the second portion. The first non-single crystalline semiconductor layer 20 is formed and may protect the semiconductor substrate 10 before the trench.

<Manufacturing Method According to Exemplary Embodiment 1>

A manufacturing method according to exemplary embodiment 1 will be described hereinafter with reference to FIG. 2 to FIG. 6.

FIG. 2 to FIG. 6 is cross-sectional views of manufacturing method of a photoelectric conversion device according to the first exemplary embodiment of the present invention.

Figure 2:
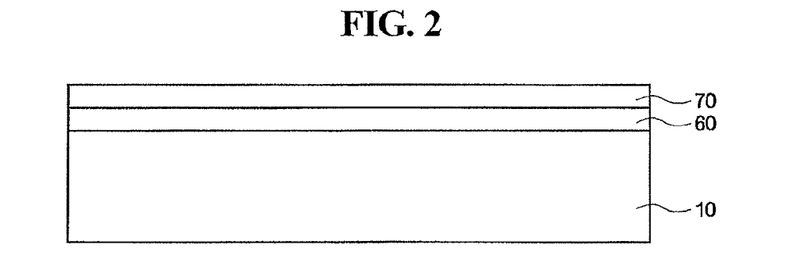
FIG. 2 to FIG. 6 are cross-sectional views of a manufacturing method of a photoelectric conversion device according to an exemplary of the present invention.

Referring to FIG. 2, a protective layer 60 is formed on the front side of a semiconductor substrate 10, and then an anti-reflection layer 70 is formed on the protective layer 60.

First, a semiconductor substrate 10 which has a thickness of, for example, about 50 to about 200 μm is cleaned and dried. Then, the semiconductor substrate is placed in a vacuum chamber to form a protective layer 60. A silicon compound, such as, for example, silane (SiH4), and hydrogen is introduced into the chamber and a plasma ignition is processed to make an a-Si (intrinsic a-Si) as a protective layer 60. The protective layer may be formed by, for example, a physical, chemical or physic-chemical method such as a chemical vapor deposition (CVD) method, a sputtering method or a spin coating method. The protective layer 60 may be made of an inorganic material which contains silicon (Si), nitrogen (N), oxygen (O), or hydrogen (H), such as, for example, SiOx, or SiNx and may be made of an organic material.

A transparent anti-reflection layer 70 is formed on a front side of the protective layer 60, for example, a protective layer 60 formed of SiNx, by using silane (SiH4), ammonia (NH3) and etc. Furthermore, for example, TiOx, ZnO, ZnS or etc. layer formed by a CVD, sputtering or a spin coating may be used for the anti-reflection layer.

Figure 3:
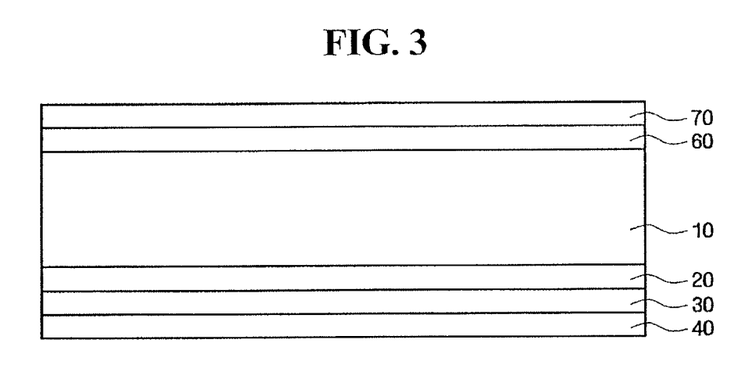

Next, referring to FIG. 3, a manufacturing method of a first non-single crystalline semiconductor layer, a conductive layer and a transparent conductive layer is explained hereinafter.

After the protective layer and the anti-reflection layer are formed on the semiconductor substrate, the semiconductor substrate is turned over for the next process step. When the semiconductor substrate is processed after being turned over, the protective layer may guard the semiconductor substrate 10.

A first non-single crystalline semiconductor 20 is formed on the back side of the semiconductor substrate 10. (When the semiconductor substrate is turned over in the process, the upper surface is the back side of the substrate before the turning over. Here, for a better understanding of the drawings and the completed device, the explanation of the drawings uses a "back side" expression.) An intrinsic amorphous silicon layer is formed as an example of a first non-single crystalline semiconductor layer. A silicon compound, such as, for example, SiH4, and hydrogen is inputted into the chamber and an a-Si layer is formed by a plasma discharge. For example, the thickness of the intrinsic a-Si layer may be, about 20 to about 1000 Å and a plasma enhanced chemical vapor deposition (PECVD) process may be used.

A first conductive layer 30 is formed on a back side of the first non-single crystalline semiconductor layer 20. The conductive layer includes a first impurity and forms a P-N junction with the semiconductor substrate.

For example, using a PECVD method, a silicon compound (such as SiH4), hydrogen, diborane (B2H6) as an impurity is inputted into the chamber and a P-type a-Si layer is formed by a plasma process. The thickness of the conductive layer 30 is, for example, about 30 to about 100 Å. The first impurity may be, for example, a P-type chemical or an N-type chemical.

A transparent conductive layer 40 is formed on a back side of the first conductive layer 30 using, for example, a CVD, or sputtering method. A transparent conductive layer 40 is formed with, for example, ITO (idium tin oxide), IZO (indium zinc oxide), ZnO (zinc oxide), or etc. and the thickness of the transparent conductive layer 40 may be, for example, about 10 to about 1000 Å.

Next, referring to FIG. 4, a collector electrode in a first portion and an injection method in a second portion is explained hereinafter.

Figure 4:
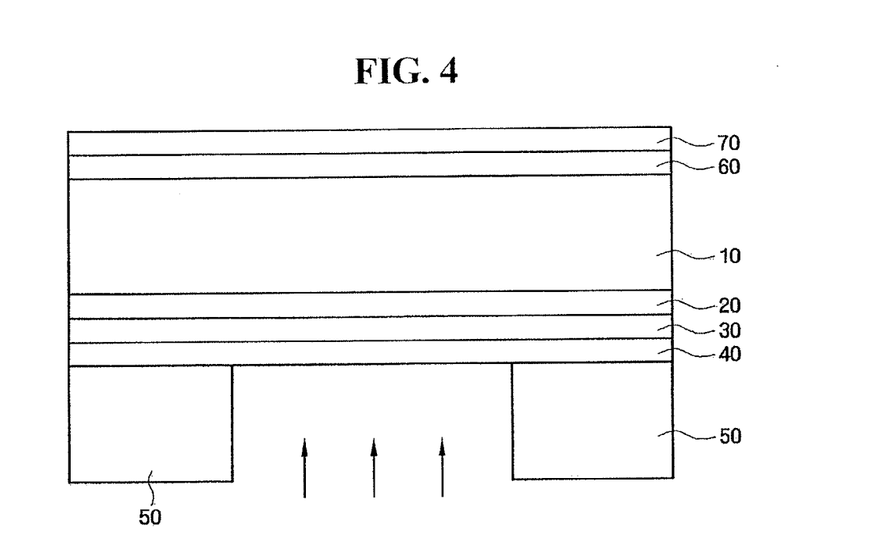

As shown in FIG. 4, a first collector electrode 50 is formed on the first portion of the semiconductor substrate 10. The first collector electrode 50 may include, for example, silver (Ag), gold (Au), copper (Cu), aluminum (Al) or alloys thereof. The first collector electrode 50 may be formed by, for example, an ink jet process, screen printing, gravure printing, offset printing, sputtering, vacuum deposition etc. using a conductive paste including the above metals. After forming a metal layer on the substrate by sputtering, photolithography is used to pattern a first collector on a first portion of the substrate.

Referring to FIG. 4, using the first collector electrode 50 as a mask, the first portion of the substrate under the first collector electrode 50 is covered. A second impurity is injected on an exposed second portion which is uncovered by the first collector electrode. Like this, the second impurity is doped in the second portion by the first collector electrode as a mask and the second impurity may be doped by a separate shadow mask for covering the first portion. For example, an ion shower, a thermal diffusion, or an implantation is used for doping the impurity. The second impurity which is different from the first impurity may be used. The first impurity may be a P type impurity and the second impurity may be an N type impurity. In other embodiments, the first impurity may be an N type impurity and the second impurity may be a P type impurity.

When the first conductive layer 30 is formed using a boron (B) compound as an impurity, the exposed second portion is doped with a compound including group 5 elements such as, for example, phosphorus (P).

When doping the second impurity, the doping target depth is a depth of the first conductive layer 30. So the second impurity is injected in the exposed second portion of the first conductive layer 30. The concentration of the second impurity should be greater than that of the first impurity in the first conductive layer 30. For example, when the first conductive layer 30 is formed using a P type impurity by a CVD method, the concentration of the first impurity in the first conductive layer is about $1.0 \times 10^{19}$ atoms/cm3, and then, with an ion implantation method, the second portion has an impurity concentration of about $2.0 \times 10^{19}$ to $1.0 \times 10^{20}$ atoms/cm3.

As explained above, if the second portion is doped with the second impurity using the first collector electrode as a mask, the first portion and the second portion of the conductive layer may have different characteristics from each other without a separate mask. So, the process is simplified, cost is saved and the time of the process is decreased.

Figure 5:
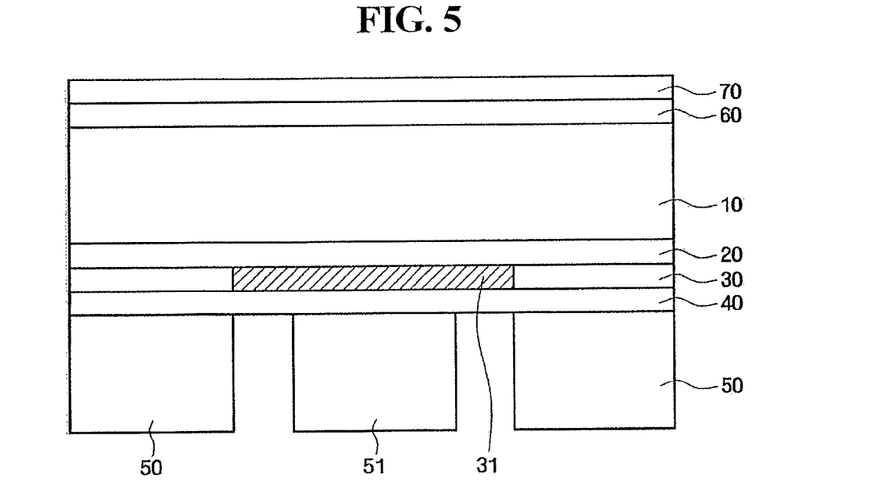

Referring to FIG. 5, a second collector electrode 51 is formed in the second portion of the substrate. The second collector electrode 51 is formed using a method similar to the first collector electrode.

Figure 6:
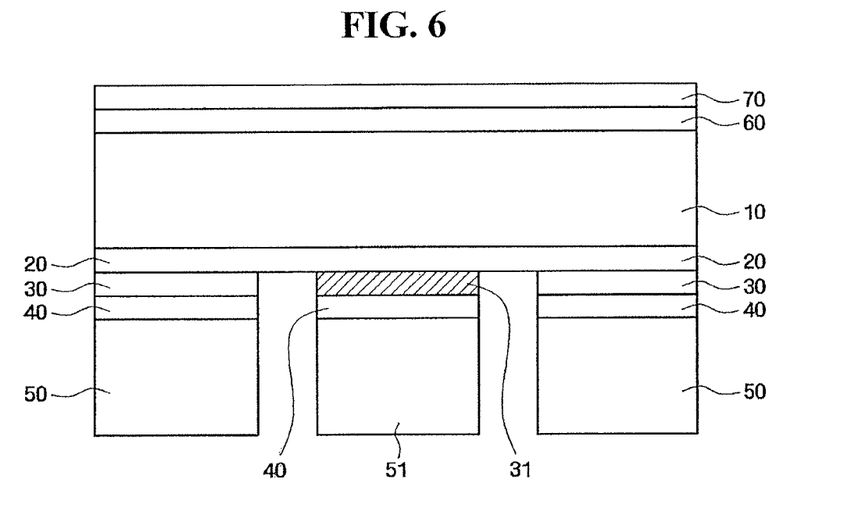

As shown in FIG. 6, a trench is formed near the second collector electrode 51 for removing a shunt path between the transparent electrodes 40 and between the first conductive layer 30 and the second conductive layer 31

The trench may be formed through, for example, a wet etching method which etches both the transparent conductive layer 40 and the second conductive layer 31 using a weak acid or through dry etching of the conductive layer in a plasma chamber after wet etching of the transparent conductive layer. The trench may be formed using, for example, a laser for removing the conductive layer 31 and the transparent conductive layer 40 between the first collector electrode 50 and the second collector electrode 51.

<Exemplary Embodiment 2>

Figure 7:
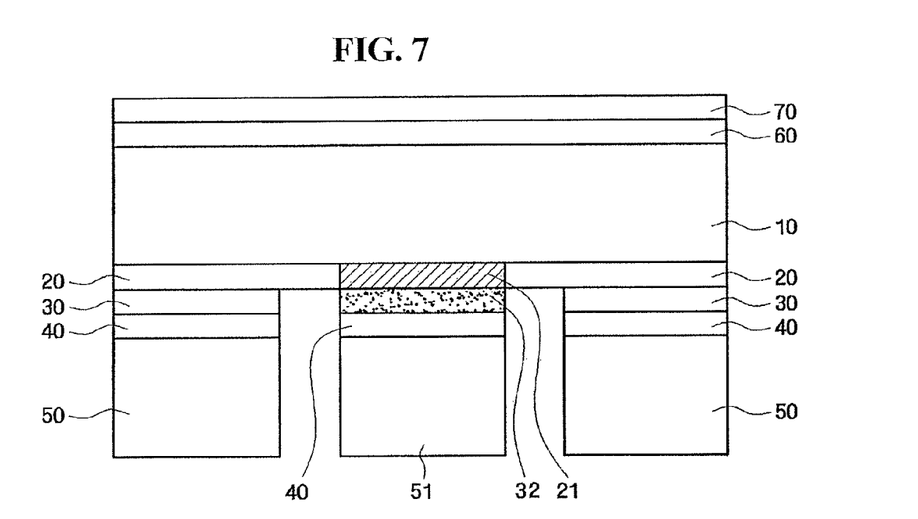
FIG. 7 is a cross-sectional view of a photoelectric conversion device according to an exemplary embodiment of the present invention.

Referring to the FIG. 7, a photoelectric conversion device according to a second exemplary embodiment of the present invention is explained.

FIG. 7 is a cross-sectional view of a photoelectric conversion device according to a second exemplary embodiment of the present invention.

The photoelectric conversion device includes a semiconductor substrate 10 having a front side and a back side, a protective layer 60 formed on the front side of the semiconductor substrate, an anti-reflection layer 70 formed on the front side of the protective layer, non-single crystalline semiconductor layers 20, 21 formed on a back side of the semiconductor substrate 10, first and second conductive layers 30, 31 formed on the back side of the first non-single crystalline semiconductor layer, a transparent conductive layer 40 and collector electrodes 50, 51.

Here, the semiconductor substrate 10, the protective layer 60 and the anti-reflection layer 70 are the same as explained in relation to exemplary embodiment 1 above.

First and second non-single crystalline semiconductor layer 20, 21 are formed on a back side of the semiconductor substrate 10. The non-single semiconductor layer 20, 21 have a different crystallinity to the semiconductor substrate 10. For example, a single crystalline or polycrystalline silicon wafer having an impurity may be used as the semiconductor substrate 10, and an a-Si layer or microcrystalline silicon layer may be used as the first and second non-single crystalline semiconductor layers 20, 21 on the back side of the substrate. The first non-single crystalline semiconductor layer 20 on the first portion of the semiconductor substrate is an intrinsic layer which does not include an impurity. A first conductive layer 30 which has a first impurity, a transparent conductive layer 40 and a first collector electrode is sequentially formed on the back side of the first non-single crystalline semiconductor layer. The second non-single crystalline semiconductor layer 21 on the second portion of the semiconductor substrate is a doped layer which includes a second impurity. Here, the concentration of the second impurity in the second non-single crystalline semiconductor layer 21 is substantially the same as that of the first impurity in the first conductive layer 30. A second conductive layer 32 is formed on a back side of the second non-single crystalline semiconductor layer 21. The second conductive layer 32 contains both the first impurity and the second impurity. The concentration of the first impurity is greater than or equal to that of the second impurity in the second conductive layer 32. A transparent conductive layer 40 and a second collector electrode 51 are sequentially formed on the back side of the second conductive layer 32.

A manufacturing method of the photoelectric conversion device according to the second exemplary embodiment of the present invention is explained hereinafter.

A protective layer 60 and an anti-reflection layer are formed on a front side of the semiconductor substrate 10. A first non-single crystalline semiconductor layer 20, a first conductive layer 30, a transparent conductive layer 40 and a first collector electrode 50 is sequentially formed on the back side, a first portion, of the semiconductor substrate 10. (The manufacturing method of the embodiment 1 illustrated in FIG. 2 to FIG. 4 is also applicable here.) A second impurity is injected in the second portion using the first collector electrode 50 as a mask. Contrary to the first exemplary embodiment of the present invention, in this second exemplary embodiment, the second impurity is injected with a depth target of the depth of the first non-single crystalline semiconductor layer 20, which is deeper than in the first exemplary embodiment. With this process, the second conductive layer 32 (this portion corresponds to the second portion of the first conductive layer 30 in FIG. 4 before doping) is formed through doping in the first conductive layer 30 (FIG. 4) with the second impurity. Therefore, the second conductive layer 32 includes both the first impurity and the second impurity. The concentration of the first impurity is greater than or substantially equal to that of the second impurity in the second conductive layer 32. After doping the second portion, a second collector electrode is formed on the second portion and a trench is formed near the second collector electrode as in exemplary embodiment 1.

The first non-single crystalline semiconductor layer 20 or the second non-single crystalline semiconductor layer 21, which includes the second impurity, may block the back side of the semiconductor substrate 10 from the trench and may protect the semiconductor substrate 10 from the trench. The first non-single crystalline semiconductor layer 20 or the second non-single crystalline semiconductor layer 21 are used in this exemplary embodiment, but other materials such as, for example, organic or inorganic materials may be used for protecting the semiconductor surface from the trench.

<Exemplary Embodiment 3>

Figure 8:
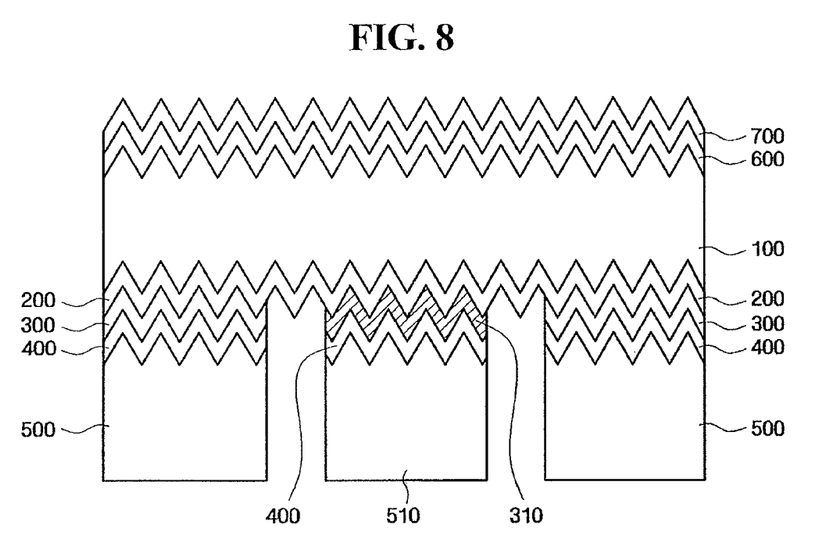
FIG. 8 is a cross-sectional view of a photoelectric conversion device according to an exemplary embodiment of the present invention.

FIG. 8 is a cross-sectional view of a photoelectric conversion device according to a third exemplary embodiment of the present invention.

As shown in FIG. 8, a photoelectric conversion device according to a third exemplary embodiment of the present invention may include at least one textured (embossing) portion in any portion of the photoelectric conversion device.

The surface of the semiconductor substrate 100 may include a textured (embossing) surface. The front side or back side of the semiconductor substrate 100 may have an embossing surface, and as illustrated in FIG. 8 both the front side and the back side may have an embossing surface.

For making a textured (embossing) surface, a semiconductor substrate is dipped into the mixture of, for example, potassium hydroxide (KOH) or sodium hydroxide (NaOH) solution and IPA (isopropyl alcohol). For example, about a 5 μm height pyramid-like embossing (texture) is formed. Secondary texturing may be processed with, for example a mixture or solution of hydrofluoric acid (HF) and nitric acid (HNO3) and then ammonium hydroxide (NH4OH) or hydrochloric acid (HCl). In this way, the semiconductor substrate 100 may come to have an embossing on the front and back surfaces, and then any additional layer formed on the semiconductor substrate 100 has an embossing surface following the embossing of the substrate in a process afterwards. If a light adsorption layer, and the substrate, have an embossing as illustrated in FIG. 8, a light path of an incident light may elongated and the light efficiency adsorption may be increased therefrom.

The photoelectric conversion device according to the third exemplary embodiment includes a semiconductor substrate 100, having a front side and a back side, a protective layer 600 formed on the front side of the semiconductor substrate, an anti-reflection layer 700 formed on the front side of the protective layer. The role and function of the protective layer and anti-reflection layer can be the same as in the first exemplary embodiment of the invention.

A first non-single crystalline semiconductor layer 200 formed on the back side of the semiconductor substrate 100 is formed following the embossing of the substrate. A first conductive layer 300 having a first impurity formed on a first portion of the back side of the first non-single crystalline semiconductor layer 200 is also formed. The first impurity may be, for example, a P type impurity and may be an N type impurity. The first impurity may be an element that has an electric polarity opposite to the first substrate. (The substrate may have an impurity.) For example, if the semiconductor substrate 100 includes an N type impurity, the first conductive layer 300 may have a P type impurity. As drawn in FIG. 8, a transparent conductive layer 400 is formed on the back side of the first conductive layer 300 and a first collector electrode 500 is formed on the transparent conductive layer 400.

A second conductive layer 310 having the first impurity and a second impurity is formed on a second portion of the back side of the first non-single crystalline semiconductor layer 200. The first impurity may be a P type impurity or N type impurity and the electric polarity of the second impurity is opposite from the first impurity. If the first conductive layer 300 has a P type impurity, the second conductive layer 310 may have both a P type impurity and N type impurity. The concentration of the second impurity is greater than that of the first impurity in the second conductive layer 310. The second conductive layer 310 includes the first impurity and the second impurity, and the second conductive layer 310 has opposite electric polarity compared to the first conductive layer 300 because the concentration of the second impurity is greater than the first impurity. The concentration of the second impurity may be, for example, about 2 to about 10 times greater than that of the first impurity in the second conductive layer 31. A transparent conductive layer 400 is formed on the back side of the second conductive layer 310 and a second collector electrode 510 is formed on the transparent conductive layer 400.

A trench is formed between the first portion and the second portion and the trench divides the first portion and the second portion. The first non-single crystalline semiconductor layer 200 is formed on the back side of the substrate between the first portion and the second portion and protects the semiconductor substrate 100 from the trench.

<Exemplary Embodiment 4>

Figure 9:
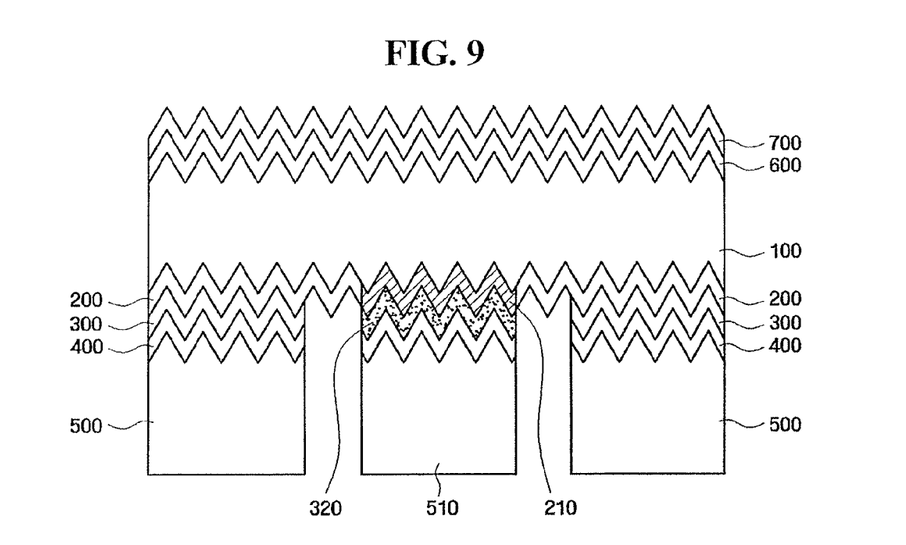
FIG. 9 is a cross-sectional view of a photoelectric conversion device according to an exemplary embodiment of the present invention.

Referring to FIG. 9, a photoelectric conversion device according to a fourth exemplary embodiment of the present invention is explained.

FIG. 9 is a cross-sectional view of a photoelectric conversion device according to a fourth exemplary embodiment of the present invention.

As shown in FIG. 9, a photoelectric conversion device according to a fourth exemplary embodiment of the present invention may include at least one textured (embossing) portion in any portion of the photoelectric conversion device like the third exemplary embodiment of the present invention. The photoelectric conversion device according to the fourth exemplary embodiment may include a semiconductor substrate 100 having an embossing, a protective layer 600 formed on the front side of the semiconductor substrate 100, an anti-reflection layer 700 formed on the front side of the protective layer, non-single crystalline semiconductor layers 200, 210 formed on the back side of the semiconductor substrate 100, first and second conductive layers 300, 320, a transparent conductive layer 400 and collector electrodes 500, 510.

Here, the semiconductor substrate 100, the protective layer 600 and the anti-reflection layer 700 are the same as explained in relation to exemplary embodiment 1 above.

First and second non-single crystalline semiconductor layer 200, 210 are formed on the back side of the semiconductor substrate 100. The first non-single crystalline semiconductor layer 200 on the first portion of the semiconductor substrate is an intrinsic layer which does not include an impurity. A first conductive layer 300 which has a first impurity, a transparent conductive layer 40 and a first collector electrode is sequentially formed on the back side of the first non-single crystalline semiconductor layer 200. The second non-single crystalline semiconductor layer 210 on the second portion of the semiconductor substrate is a doped layer which includes a second impurity. Here, the concentration of the second impurity in the second non-single crystalline semiconductor layer 210 is substantially the same as that of the first impurity in the first conductive layer 300. A second conductive layer 320 is formed on the back side of the second non-single crystalline semiconductor layer 210. The second conductive layer 320 contains both the first impurity and the second impurity. The concentration of the first impurity is greater than or equal to that of the second impurity in the second conductive layer 320. A transparent conductive layer 400 and a second collector electrode 510 are sequentially formed on the back side of the second conductive layer 320.

A manufacturing method of the photoelectric conversion device according to the fourth exemplary embodiment of the present invention is explained hereinafter.

A protective layer 600 and an anti-reflection layer 700 are formed on a front side of the semiconductor substrate 100. A first non-single crystalline semiconductor layer 200, a first conductive layer 300, a transparent conductive layer 400 and a first collector electrode 500 are sequentially formed on the back side of a first portion of the semiconductor substrate 100. (The manufacturing method of exemplary embodiment 1 illustrated in FIG. 2 to FIG. 4 is also applicable here.) A second impurity is injected in the second portion using the first collector electrode 500 as a mask. Contrary to the first exemplary embodiment of the present invention, in this fourth exemplary embodiment, the second impurity is injected with a depth target of the depth of the first non-single crystalline semiconductor layer 200, which is deeper than in the first exemplary embodiment. With this process, the second conductive layer 320 (this portion corresponds to the second portion of the first conductive layer 30 in FIG. 4 before doping) is formed through doping the first conductive layer 300 (FIG. 4) with the second impurity. Therefore the second conductive layer 320 includes both the first impurity and the second impurity. The concentration of the first impurity is greater than or substantially equal to that of the second impurity in the second conductive layer 320. After doping the second portion, a second collector electrode 510 is formed on the second portion and a trench is formed near the second collector electrode as in the exemplary embodiment 1.

The first non-single crystalline semiconductor layer 200 or the second non-single crystalline semiconductor layer 210, which includes the second impurity, blocks the back side of the semiconductor substrate 100 from the trench and protects the semiconductor substrate 100 from the trench. The first non-single crystalline semiconductor layer 200 or the second non-single crystalline semiconductor layer 210 are used in this exemplary embodiment, but other materials such as, for example, organic or inorganic materials may be used to protect the semiconductor surface from the trench.

<Exemplary Embodiment 5>

FIG. 10 to FIG. 13 are cross-sectional views of manufacturing method of a photoelectric conversion device according to fifth exemplary embodiment of the present invention.

Figure 10:
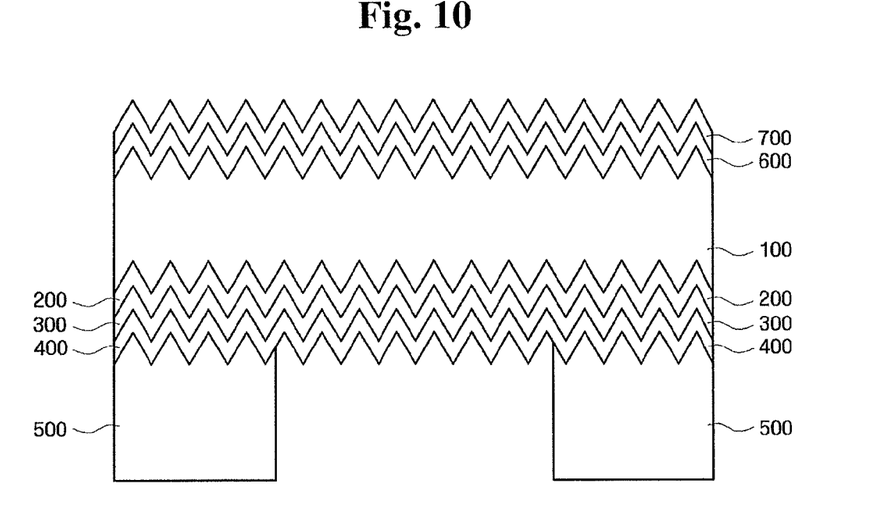
FIG. 10 to FIG. 13 are cross-sectional views of manufacturing method of a photoelectric conversion device according to fifth exemplary embodiment of the present invention.

First, referring to FIG. 10, a texturing is formed at the front side or back side of a semiconductor substrate.

As stated above, the semiconductor substrate 100 is dipped in a solution such as, for example, KOH or NaOH or an IPA (isopropyl alcohol) mix solution. As such, a pyramid-type texture with the height of, for example, about 5 μm is formed. Then, secondary texturing is processed with a mix solution such as, for example, HF and HNO3, and a solution such as, for example, NH4OH and HCl is used for processing.

Then, a first non-single crystalline semiconductor layer 200, a first conductive layer 300 including first impurity (e.g., p-type impurity), and a first transparent conductive layer 400 are gradually formed. For example, PECVD method or sputtering method can be used to be formed.

Then, first collector electrode is formed at the first region of a semiconductor layer 10. The first collector electrode 50 consists of, for example, silver (Ag), gold (Au), copper (Cu), aluminum (Al) and their alloy, and can be formed by a method such as, for example, inkjet printing, screen printing, gravure printing, offset printing, etc. Also, vacuum evaporation such as, for example, sputtering can be formed for formation. As illustrated in FIG. 4, a first collector electrode 50 is formed at the first region. If a first collector electrode 50 is formed through a method such as sputtering, patterning is performed so that the first collector 50 is formed only on the first region using photo lithography.

Figure 11:
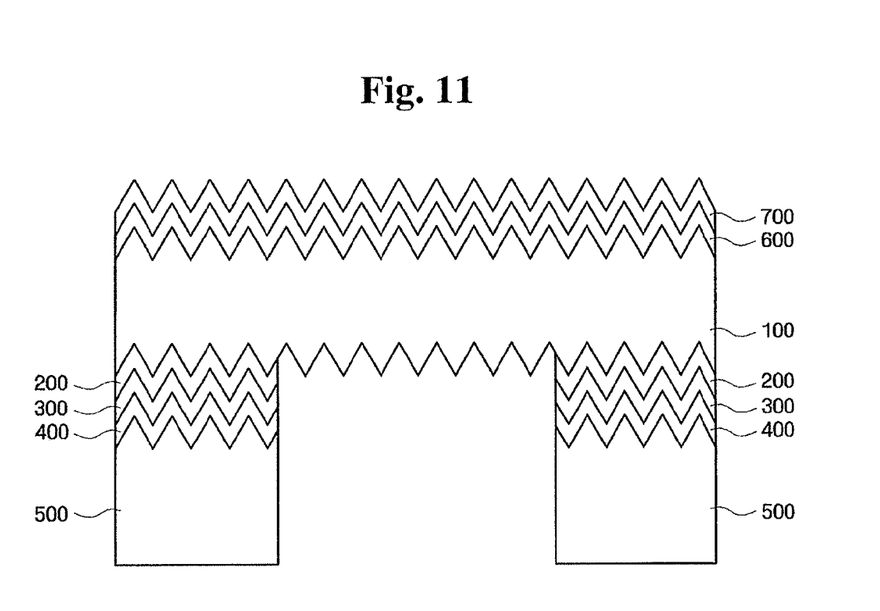

Referring FIG. 11, the first transparent conductive layer 400, the first conductive layer 300, and the first non-single crystalline semiconductor layer 200, which are formed at the second region of the semiconductor substrate 10, are removed.

For example, first, a portion of the first transparent conductive layer is removed using wet etching.

Even though a portion of the first transparent conductive layer 400 is removed using wet etching, the etching selection ratio of the transparent conductive layer 400 and the first collector electrode 500 can be secured because the height of the first collector electrode can be formed, for example, up to about 40 μm, and the thickness of the first transparent conductive layer 400 can be formed as, for example, about 10 to about 1000 Å as stated above. Hence, the difference in thickness of the first transparent conductive layer 400 and the first collector electrode 500 may be more than about 100 times. Hence, the etching selection ratio can be sufficiently secured.

Also, for example, an indium tin oxide (ITO) etchant of hydrochloric acid (HCL)+nitric acid (HNO3)+deionized (D.I) water or integrated etchant of phosphoric acid (H3PO4)+acetic acid (CH3COOH)+nitric acid (HNO3)+deionzed (D.I) water may be used as the etchant that is available at the wet etching.

Then, the first conductive layer 300 exposed using, for example, dry etching is etched.

When using dry etching, etching gas that does not contain sulfur can be used. For example, a fluorocarbon (CxFy)-type etching gas may be used. Some examples of CxFy-type etching gas include but are not limited to hexafluorobutadiene (C4F6), octafluorocyclobutane (C4F8) and octafluoropentene (C5F8). It is because, if the first collector electrode 500 contains silver (Ag), the etching gas that contains sulfur forms silver sulfide (AgS) well. For example, AgS is formed faster as the temperature gets higher.

Figure 12:
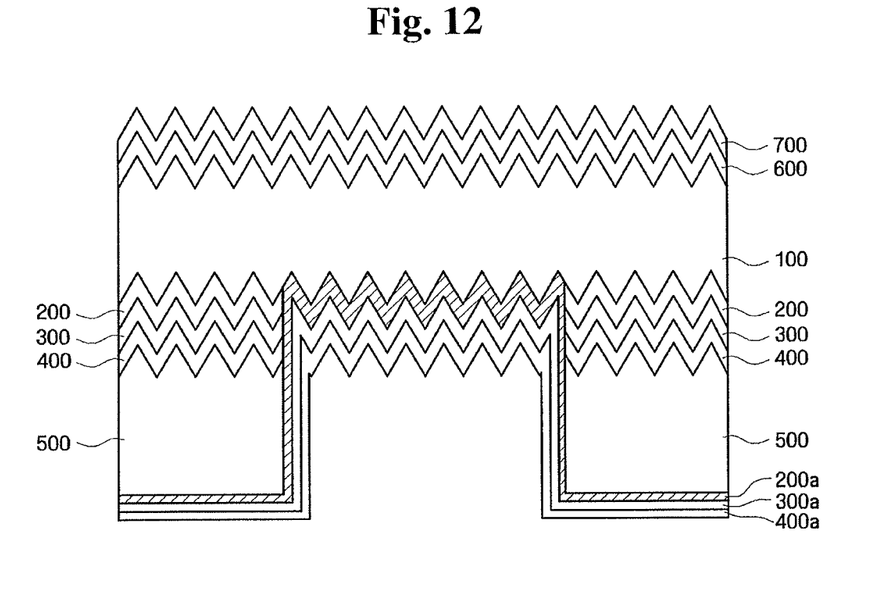

Referring to FIG. 12, a second non-single crystalline semiconductor layer 200A, a second conductive layer 310A that contains a second impurity (e.g., N-type impurity) and a second transparent conductive layer 400A are gradually formed.

Figure 13:
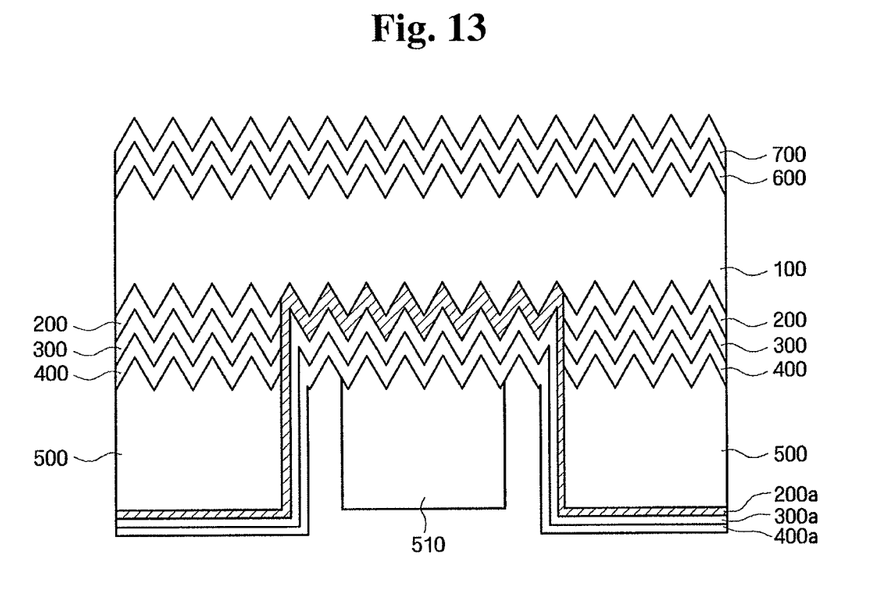

Referring to FIG. 13, a second collector electrode 510 is formed on the second region of the back side of the semiconductor substrate 10.

Then, a photoelectric conversion device is completed by removing the second non-single crystalline semiconductor layer 200A, the second conductive layer 310A and the second transparent conductive layer 400A, which are formed on the first region of the back side of the semiconductor substrate 10. After the removal, the second conductive layer 310 and the transparent conductive layer 400, which remain on the second region, are respectively separated from the first conductive layer 300 and the transparent conductive layer 400. The result is substantially similar to that of FIG. 8.

Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. A manufacturing method of a photoelectric conversion device, the method comprising:
    forming a protective layer on a front side of a semiconductor substrate;
    forming a first non-single crystalline semiconductor layer, a first conductive layer comprising a first impurity and a transparent conductive layer on a back side of the semiconductor substrate;
    forming a first collective electrode on a first portion of a back side of the transparent conductive layer; and
    forming a second conductive layer including the first impurity and a second impurity by inputting a second impurity in a second portion of the first conductive layer, wherein the second portion of the first conductive layer is exposed by the first collective electrode on a back side of the first conductive layer,
    wherein:
    the first impurity comprises a group 3 or 5 element, the second impurity comprises a group 3 or 5 element, and the first and second impurities comprise different group elements than each other; and
    the first and second conductive layers include polycrystalline or amorphous silicon.

2. The manufacturing method of a photoelectric conversion device of claim 1, wherein inputting the second impurity in the second portion comprises using the first collective electrode as a mask.

3. The manufacturing method of a photoelectric conversion device of claim 2, wherein a concentration of the second impurity in the second conductive layer is greater than that of the first impurity in the second conductive layer.

4. The manufacturing method of a photoelectric conversion device of claim 3, further comprising forming a second collective electrode on a back side of the second portion of the transparent conductive layer.

5. The manufacturing method of a photoelectric conversion device of claim 2, wherein the concentration of the second impurity is less than or equal to that of the first impurity in the second conductive layer.

6. The manufacturing method of a photoelectric conversion device of claim 5, further comprising forming a second non-single crystalline semiconductor layer by inputting a second impurity in the second portion of the first non-single crystalline semiconductor layer.

7. The manufacturing method of a photoelectric conversion device of claim 6, further comprising forming a second collective electrode on a second portion of the back side of the transparent conductive layer.

* * * * *